United States Patent
Kamigaichi et al.

(10) Patent No.: US 8,751,888 B2
(45) Date of Patent: Jun. 10, 2014

(54) NON-VOLATILE SEMICONDUCTOR MEMORY DEVICE

(75) Inventors: Takeshi Kamigaichi, Yokohama (JP); Kenji Sawamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 272 days.

(21) Appl. No.: 13/237,291

(22) Filed: Sep. 20, 2011

(65) Prior Publication Data
US 2012/0198297 A1    Aug. 2, 2012

(30) Foreign Application Priority Data

Jan. 27, 2011    (JP) ................................. P2011-014690

(51) Int. Cl.
*G06F 11/30*    (2006.01)
*G08C 25/00*    (2006.01)
*H03M 13/00*    (2006.01)
*H04L 1/00*    (2006.01)

(52) U.S. Cl.
USPC ........... 714/746; 714/726; 714/727; 714/798; 365/185.11; 365/185.22; 365/185.28; 365/189.05

(58) Field of Classification Search
USPC ............. 714/746, 798, 726–727; 365/185.11, 365/185.22, 185.28, 189.05
See application file for complete search history.

(56) References Cited

U.S. PATENT DOCUMENTS

| | | | | |
|---|---|---|---|---|
| 6,831,859 B2 * | 12/2004 | Hosono et al. | ........... | 365/185.09 |
| 7,779,316 B2 * | 8/2010 | Parulkar et al. | ............... | 714/719 |
| 2010/0329033 A1 | 12/2010 | Kamigaichi | | |
| 2011/0157997 A1 | 6/2011 | Kamigaichi et al. | | |
| 2011/0235413 A1 | 9/2011 | Kamigaichi | | |

FOREIGN PATENT DOCUMENTS

JP    2009-70501    4/2009

OTHER PUBLICATIONS

U.S. Appl. No. 13/239,572, filed Sep. 22, 2011, Junya Matsunami.

* cited by examiner

*Primary Examiner* — Guy Lamarre
(74) *Attorney, Agent, or Firm* — Oblon, Spivak, McClelland, Maier & Neustadt, L.L.P.

(57) ABSTRACT

A control circuit performs a write operation to 1-page memory cells along the selected word line, by applying a write pulse voltage to a selected word line, and then performs a verify read operation of confirming whether the data write is completed. When the data write is not completed, a step-up operation is performed of raising the write pulse voltage by a certain step-up voltage. A bit scan circuit determines whether the number of memory cells determined to reach a certain threshold voltage is equal to or more than a certain number among the memory cells read at the same time, according to read data held in the sense amplifier circuit as a result of the verify read operation. The control circuit changes the amount of the step-up voltage according to the determination of the bit scan circuit.

13 Claims, 11 Drawing Sheets

NON-VOLATILE SEMICONDUCTOR MEMORY DEVICE

CROSS REFERENCE TO RELATED APPLICATIONS

This application is based on and claims the benefit of priority from prior Japanese Patent Application No. 2011-14690, filed on Jan. 27, 2011, the entire contents of which are incorporated herein by reference.

FIELD

The embodiments described herein relate to a non-volatile semiconductor memory device.

BACKGROUND

A flash memory is widely used as a semiconductor memory. A flash memory utilizes a memory cell that belongs to a type of accumulating a charge in a floating gate. A Flash memory is widely used because it is a non-volatile device, as well as it provides a lower cost per 1-bit data and it can be highly integrated. Among others, a NAND flash memory can be particularly highly integrated because it includes a plurality of memory cells connected in series between select transistors, thereby providing fewer contacts between the memory cells. A multi-level storage product has been available that stores 2-bit or more data per one memory cell. Such a product can also provide a higher storage capacity, a lower cost, and a smaller space.

A data write operation (program operation) of the NAND flash memory requires a verify read operation to confirm whether the targeted threshold voltage is provided. If the verify read operation determines that the write is not sufficiently performed to the desired threshold voltage, the write voltage is stepwise raised ("a step-up operation") and then similar write and verify read operations are repeated until the desired threshold voltage is provided.

In a highly integrated flash memory having scaled-down cells, interference between adjacent memory cells affects the threshold voltage distribution of the memory cell, such as increasing the distribution width and entirely moving the distribution. Particularly, the multi-level storage scheme requires setting of a smaller width of the threshold voltage distributions and a smaller distance between the threshold voltage distributions than in the case of the binary storage scheme. Accordingly, when the multi-level storage scheme is used, adjacent-cell interference may greatly affects on the data reliability. Various methods of data write have thus been proposed to minimize the affect of the adjacent-cell interference.

In order to provide a threshold voltage distribution having a smaller distribution width and a smaller distance between the threshold voltage distributions, it is usually effective to provide a smaller step-up width (an increase width) in the step-up operation. A smaller step-up width results in, however, a longer write time and reduced performance of the non-volatile semiconductor memory device. Accordingly, there is a need for a proposed non-volatile semiconductor memory device having a reduced write time while maintaining the data reliability.

DETAILED DESCRIPTION

Figure 1:
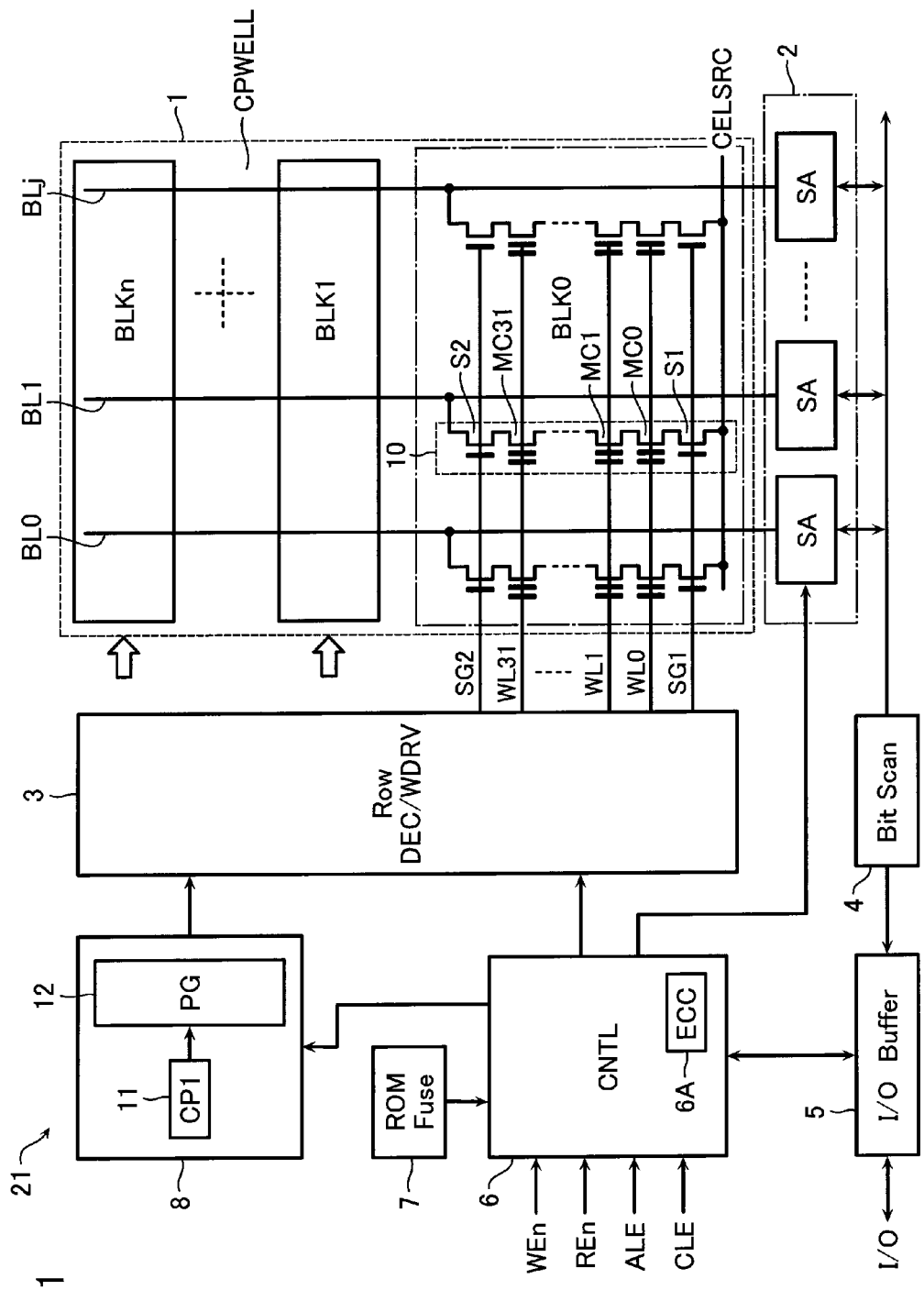
FIG. 1 shows a schematic configuration of a NAND flash memory according to a first embodiment.

A non-volatile semiconductor memory device according to the embodiments described below includes a memory cell array including a plurality of blocks, each block including a set of NAND cell units, each NAND cell unit including a memory string and a first select gate transistor and a second select gate transistor connected to the ends of the memory string, the memory string including a plurality of non-volatile memory cells connected in series. A word line commonly connects control gates of the memory cells arranged in a direction intersecting the memory string. A bit line is connected to a first end of the NAND cell unit. A source line is connected to a second end of the NAND cell unit. A sense amplifier circuit senses a potential of the bit line and determines data held in the memory cell. A control circuit performs a write operation to 1-page memory cells along the selected word line by applying a write pulse voltage to a selected word line, then performs a verify read operation of confirming whether the data write to the 1-page memory cells is completed. When the data write is not completed, the control circuit performs a step-up operation of raising the write pulse voltage by a certain step-up voltage. A bit scan circuit determines whether the number of memory cells determined to reach a certain threshold voltage is equal to or more than a certain number among the memory cells read at the same time, according to read data held in the sense amplifier circuit as a result of the verify read operation. The control circuit is adapted to change the amount of the step-up voltage according to the determination of the bit scan circuit.

The embodiments of the present invention will now be described in more detail referring to the drawings.

First Embodiment

FIG. 1 illustrates a schematic configuration of a NAND flash memory 21 according to a first embodiment of the present invention. With reference to FIG. 1, the NAND flash memory 21 includes a memory cell array 1, a sense amplifier circuit 2, a row decoder 3, a bit scan circuit 4, an input/output buffer 5, a control circuit 6, a ROM fuse 7, and a voltage generation circuit 8. The control circuit 6 provides a control portion for the memory cell array 1.

The memory cell array 1 includes a plurality of NAND cell units 10 arranged in a matrix. Each NAND cell unit 10 includes a plurality of memory cells MC (MC0, MC1, ..., and MC31) connected in series and select gate transistors S1 and S2 connected to the respective ends thereof.

Although not shown, each memory cell MC may include, as is well known, a gate-insulating film (a tunnel insulating film) formed between the drain and the source, a floating gate electrode as a charge accumulation layer formed on the gate-insulating film, an inter-gate dielectric film formed on the floating gate electrode, and a control gate electrode formed on the inter-gate dielectric film. The control gate is connected to one of the word lines.

The source of the select gate transistor S1 is connected to a common source line CELSRC. The drain of the select gate transistor S2 is connected to the bit line BL.

In each NAND cell unit 10, the control gates of the memory cells MC are connected to different word lines WL (WL0, WL1, ..., and WL31). The gates of the select gate transistors S1 and S2 are connected to respective select gate lines SG1 and SG2 running in parallel with the word lines WL. A set of memory cells sharing one word line form one or more pages depending on the bit number stored in each one-memory cell. The write operation is performed in units of a page. Specifically, data is written to a plurality of memory cells at the same time. A set of NAND cell units 10 sharing the word lines WL and the select gate lines SG1 and SG2 provides a block BLK as a unit of data erase.

With reference to FIG. 1, the memory cell array 1 includes a plurality of blocks BLK (BLK0, BLK1, ..., and BLKn) in the bit line BL direction. The memory cell array 1 including these blocks is formed in one cell well (CPWELL) on a silicon substrate.

The bit lines BL of the memory cell array 1 are connected to the sense amplifier circuit 2. The sense amplifier circuit 2 includes a plurality of sense amplifiers SA. The circuit 2 provides a page buffer for sensing read data and holding write data. The sense amplifier circuit 2 includes a column selection gate. The row decoder (including a word line driver) 3 selectively drives the word lines WL and the select gate lines SG1 and SG2.

As a result of the verify read operation after the programming operation, read data is held in the page buffer of the sense amplifier circuit 2. The bit scan circuit 4 counts, according to the read data, the verify pass bit number to determine whether the count is equal to or more than a certain number. According to the determination of the bit scan circuit 4, the control circuit 6 determines whether the write to the memory cells along one word line WL is completed. Also, according to the determination of the bit scan circuit 4, the control circuit 6 changes a step-up voltage $\Delta$VPGM of a write voltage VPGM, as described below.

Figure 2:
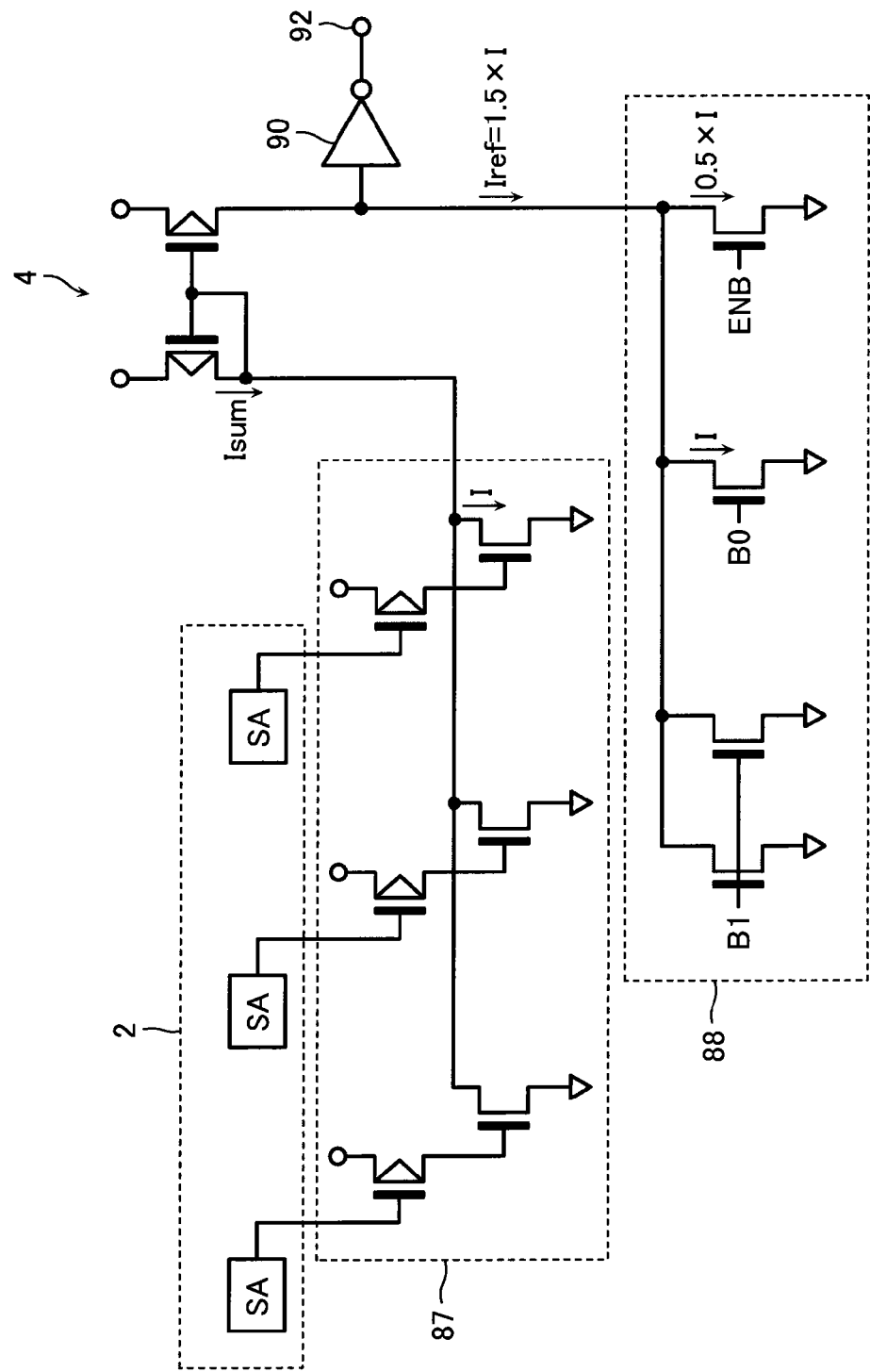
FIG. 2 shows example circuitry of the bit scan circuit 4 in FIG. 1.

FIG. 2 shows an example circuit configuration of the bit scan circuit 4. The bit scan circuit 4 includes a sense current path 87, a reference constant current path 88, an inverter 90, and an output node 92. The sense amplifier circuits 2 for one page hold path/fail data as the verify read result. It is assumed here that an "H" level is held when the verify read result is "PASS" and an "L" level is held for "FAIL."

The bit scan circuit 4 of the above configuration operates to detect, from the output node 92 of the inverter 90, a differential current between a current Isum through the sense current path 87 and a reference current Iref through the reference constant current path 88. The reference constant current path 88 includes MOS transistors. Signals B0 and B1 are supplied to the gate terminals of the MOS transistors. The signals B0 and B1 are signals that are set in response to the reference value to be compared with the verify pass bit number.

Referring back to FIG. 1, the data input/output buffer 5 gives and receives data between an external input/output terminal and the sense amplifier circuit 2 and the bit scan circuit 4. The buffer 5 also receives command data and address data.

The control circuit 6 receives external control signals such as a write enable signal WEn, a read enable signal REn, an address latch enable signal ALE, and a command latch enable signal CLE, and controls the overall memory operation.

Specifically, the control circuit 6 includes a command interface and an address hold/transfer circuit and determines whether supplied data is write data or address data. In response to this determination, write data is transferred to the sense amplifier circuit 2 and address data is transferred to the row decoder 3 and the sense amplifier circuit 2. The control circuit 6 also controls, according to the external control signal, the sequence of read and write/erase and an applied voltage or the like.

The voltage generation circuit 8 includes a booster circuit 11 and a pulse generation circuit 12.

Figure 3:
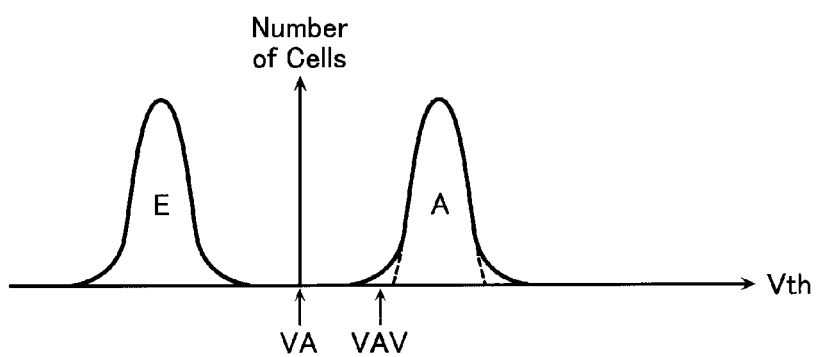
FIG. 3 shows an example threshold voltage distribution that may be held by one memory cell in a NAND flash memory according to the first embodiment.

FIG. 3 shows an example threshold voltage distribution for the binary data storage scheme applied to a NAND flash memory according to this embodiment. Two-value data is defined by a negative threshold voltage distribution E and a positive threshold voltage distribution A.

The data write is performed as an operation of selectively injecting electrons into the floating gate of the memory cell by providing the selected word line with the write voltage VPGM, the unselected word lines with a write pass voltage Vpass, and the bit line with Vss (for "0" write to raise the threshold voltage) or Vdd (for write inhibit not to raise the threshold voltage).

Specifically, for "0" write, Vss provided to the bit line is transferred to the channel of the NAND cell unit, and when the write voltage VPGM is given, electrons are injected from the channel into the floating gate by tunnel current. For "1" write (write inhibit), the NAND cell channel is charged to Vdd-Vt (the threshold voltage of the select gate transistor) to be left floating, and is boosted by capacitive coupling when the write voltage VPGM is provided, thereby preventing electron injection.

Further, the data write uses a step-up write scheme of gradually raising the write voltage for each write cycle.

The threshold voltage of each memory cell is, in most cases, if the threshold voltage distribution is considered as a normal distribution, within a certain variance of the normal distribution (hereinafter, this is referred to as "a main distribution") (shown as a dotted line in FIG. 3). Some memory cells have a threshold voltage that is distributed in the range outside the main distribution. Hereinafter, a distribution at a position higher than the main distribution is referred to as "an upper tail portion," and a distribution at a lower position thereof is referred to as "a lower tail portion." By setting the step-up voltage ΔVPGM to a low value, the amounts of the upper tail portion and lower tail portion may be reduced. This will, however, result in a reduced programming operation speed. If the upper tail portion and lower tail portion are about a few % of one threshold voltage distribution, the portions may be corrected by an error correction circuit 6A in the control circuit 6. In other words, it is unnecessary to adopt a write step of uniformly reducing the step-up voltage ΔVPGM to force the upper tail portion and lower tail portion into the main distribution.

Figure 4A:
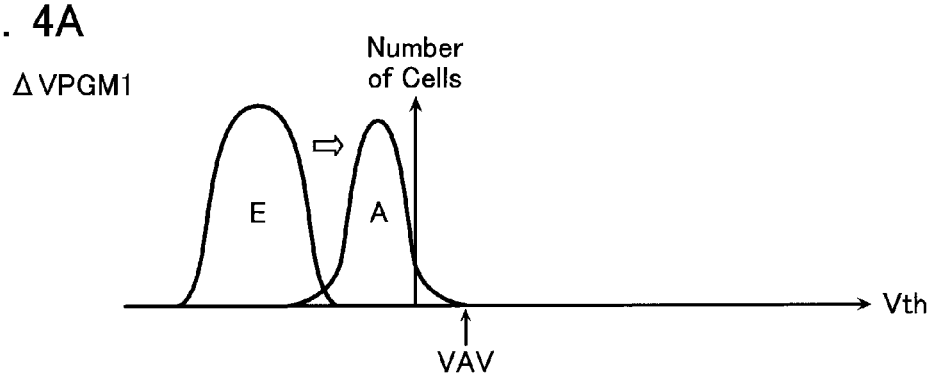
FIG. 4A is a schematic diagram for illustrating a programming operation and a step-up operation according to the first embodiment.
Figure 4B:
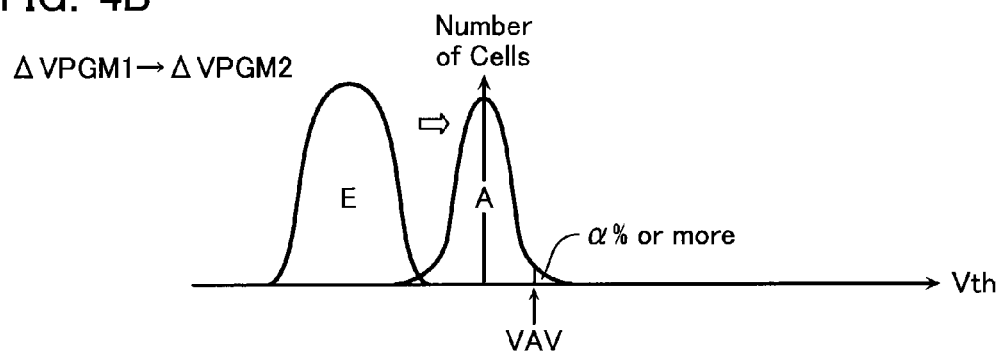
FIG. 4B is a schematic diagram illustrating a programming operation and a step-up operation according to the first embodiment.
Figure 4C:
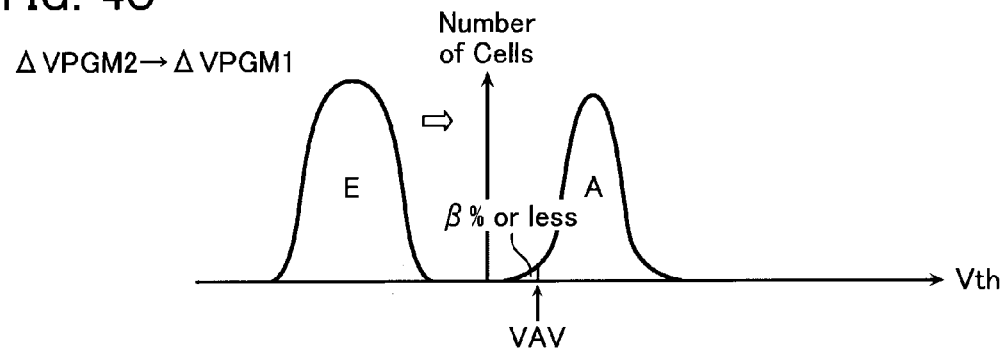
FIG. 4C is a schematic diagram illustrating a programming operation and a step-up operation according to the first embodiment.

In this embodiment, therefore, the step-up voltage ΔVPGM used in the step-up operation is controlled as follows. Note that because a plurality of memory cells are written with data at the same time, the memory cells determined as "PASS" by the verify read operation are inhibited from writing, and the memory cells determined as "FAIL" by the verify read operation are rewritten with data using a write voltage raised by the step-up operation. FIG. 4A to FIG. 4C are schematic diagrams illustrating the control of the step-up voltage ΔVPGM.

First, for the programming operation from the threshold voltage distribution E to the distribution A, the step-up voltage ΔVPGM is switched between at least two values (for example ΔVPGM1 and ΔVPGM2 (<ΔVPGM1)). With reference to FIG. 4A, at the beginning of the programming operation, the step-up voltage ΔVPGM is set to the high value ΔVPGM1. During this operation, the bit scan circuit 4 counts the number of data sets determined as "PASS", among data sets read by the verify read operation using a verify voltage VAV.

When the number of memory cells MC along one word line that have showed "PASS" is equal to or more than α% of the total number, the control circuit 6 switches the step-up voltage ΔVPGM from ΔVPGM1 to ΔVPGM2 lower than ΔVPGM1. Here, α% is determined according to the bit number recoverable by the error correction circuit 6A. By way of example, α is about 10(%) or less. Specifically, the control circuit 6 switches, if the upper tail portion of the threshold voltage distribution A becomes higher than the verify voltage VAV, the value of the step-up voltage ΔVPGM to a lower value. A portion forming the main distribution of the threshold voltage distribution A is thus written using the small step-up voltage. The distribution width of the main distribution may thus be reduced.

If then, after the programming operation proceeds and (90−β) % or more of the threshold voltage distribution A becomes higher than the verify voltage VAV, as shown in FIG. 4C, the step-up voltage ΔVPGM is set to ΔVPGM1 again. Here, β% is, for example 10% or less. The value of β% is set in consideration of the bit number correctable by the error correction circuit 6A. Specifically, the control circuit 6 switches, when all portions except the lower tail portion of the threshold voltage distribution A become higher than the verify voltage VAV, the value of the step-up voltage ΔVPGM to a higher value.

As described above, during the period until one threshold voltage distribution A is written, the step-up voltage ΔVPGM is switched at the timing when the upper tail portion of the distribution A is written and at the timing when the main distribution is written. The main distribution may thus be written in a narrow width, and the speed of the entire programming operation may be increased. The number of memory cells MC present in the upper tail portion and lower tail portion that are written using a relatively high value of ΔVPGM is a bit number recoverable by the error correction circuit 6A. This is because the number of memory cells MC of "PASS" determines the value of ΔVPGM. In other words, the reliability of data stored in the NAND flash memory is not impaired.

Figure 5:
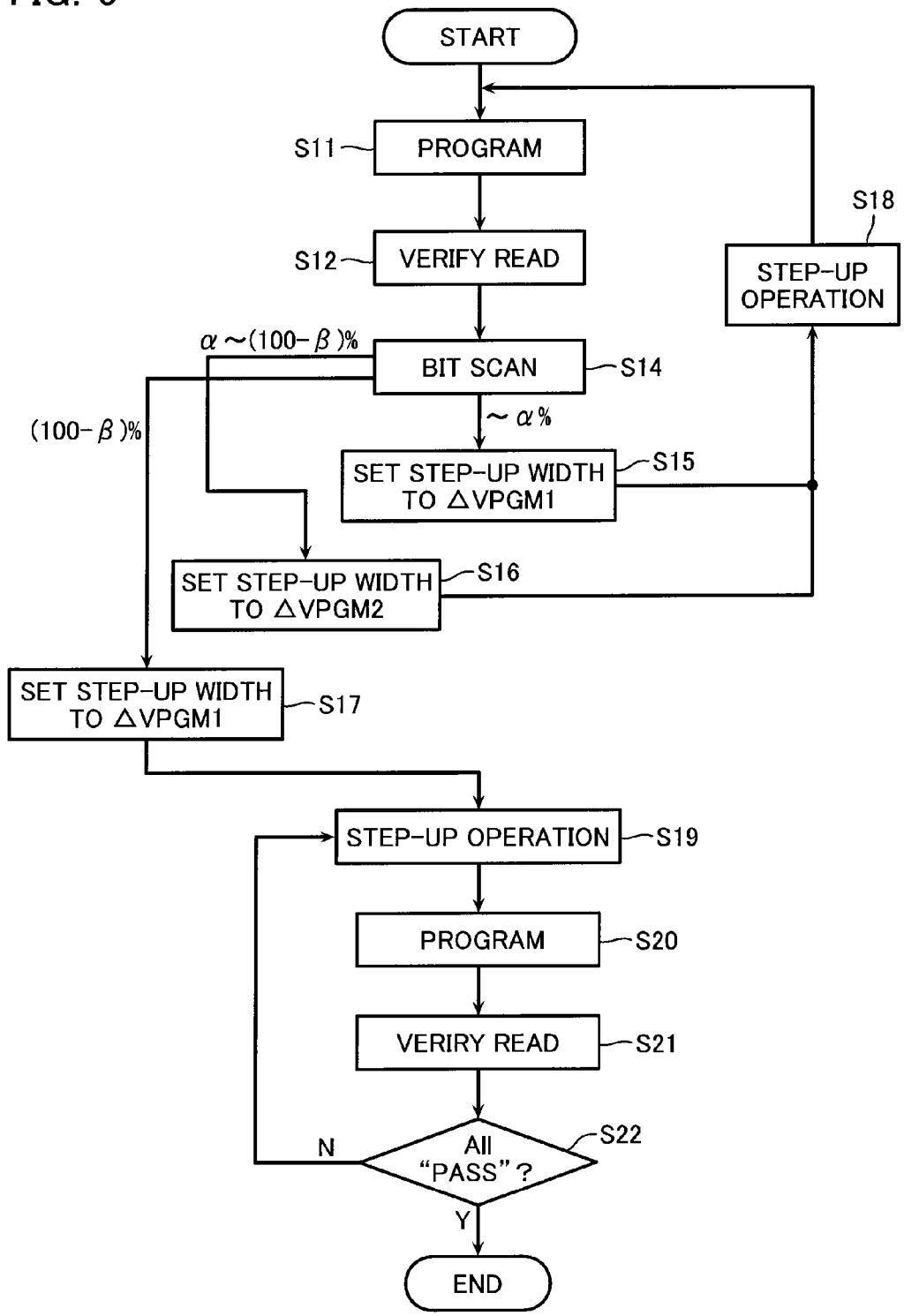
FIG. 5 is a flowchart of a procedure for a programming operation, a verify read operation, and a step-up operation according to the first embodiment.

Referring now to the flowchart in FIG. 5, the programming operation in a NAND flash memory according to this embodiment will be described.

At the beginning of the programming operation, the initial value of the step-up voltage ΔVPGM is set to ΔVPGM1. The control circuit 6 applies the selected word line WL with the initial value VPGM1 as the programming voltage VPGM to perform a programming operation along the selected word line WL (S11). Then, the selected word line WL is applied with the verify voltage VAV to perform a verify read operation to the memory cells MC along the selected word line WL (S12).

According to the result of the verify read operation, a bit scan operation is performed of counting the number of memory cells MC determined as "PASS" by the bit scan circuit 4 (S14). In other words, the number of memory cells determined as "PASS" is determined.

If the number of memory cells MC determined as "PASS" is less than α%, the step-up voltage ΔVPGM remains as the initial value ΔVPGM1 (S15). As the programming voltage VPGM, a voltage higher by ΔVPGM1 than the immediately preceding value VPGM' is set (the step-up operation: S18), and a programming operation using the stepped-up programming voltage is performed.

If the number of memory cells MC determined as "PASS" in the bit scan circuit 4 is equal to or more than α% and less than (100−β)%, the step-up voltage ΔVPGM is switched from the initial value ΔVPGM1 to ΔVPGM2 (S16), and an programming operation is performed by applying a programming voltage VPGM (=VPGM'+ΔVPGM2) that is higher by ΔVPGM2 than the immediately preceding value VPGM' (S18). And then, during the period until the number of memory cells MC determined as "PASS" in the bit scan circuit 4 is equal to or more than (100−β) %, the step-up voltage ΔVPGM2 is used.

If the number of memory cells MC determined as "PASS" in the bit scan circuit 4 is equal to or more than (100−β) %, the step-up voltage ΔVPGM is returned from ΔVPGM2 to ΔVPGM1 (S17), and a programming operation is performed by applying a programming voltage VPGM (VPGM'+ΔVPGM1) that is higher by ΔVPGM1 than the immediately preceding value VPGM' (S18). And then, the step-up voltage ΔVPGM is fixed to ΔVPGM1, and the step-up operation, the programming operation, and the verify read operation are repeated until all memory cells are determined as "PASS" (S19 to S22). Note that assuming the recovery by the ECC, the operation may be ended even if several memory cells are not "PASS".

Second Embodiment

Figure 6:
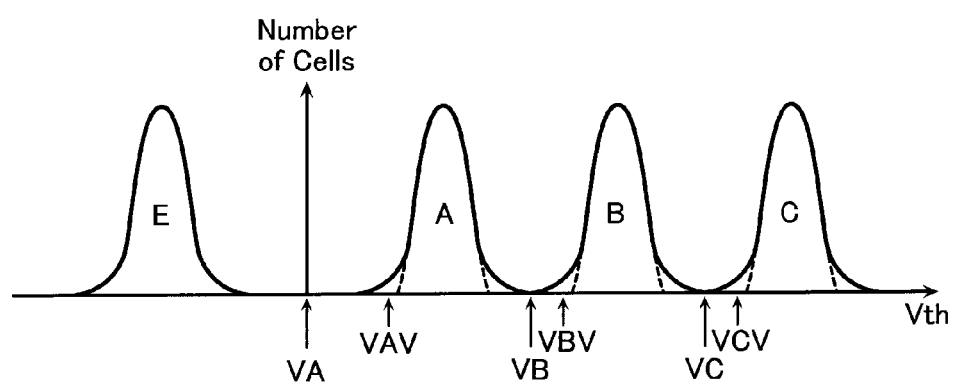
FIG. 6 shows an example threshold voltage distribution provided to a memory cell of a NAND flash memory according to a second embodiment.

Referring now to FIG. 6, a NAND flash memory according to a second embodiment will be described. The structure of a NAND flash memory in this embodiment is similar to that in the first embodiment (FIG. 1). Note, however, that this embodiment shows an example of threshold voltage distribution for a four-level data storage scheme (2 bit/cell) as shown in FIG. 6. Four-level data is defined by a negative threshold voltage distribution E and positive threshold voltage distributions A to C.

Each of the threshold voltage distributions A to C are written using verify voltages VAV, VBV, and VCV, respectively. Specifically, after the programming operation using the programming voltage VPGM, a verify read operation using 3 levels of verify voltages VAV, VBV, and VCV is performed. The result is then supplied to the sense amplifier circuit 2 and the bit scan circuit 4.

Any of the threshold voltage distributions A to C may have an upper tail portion and a lower tail portion that are outside the main distribution. Also in this embodiment, the presence of the upper tail portion and lower tail portion may be accepted if they are within a range correctable by the error correction circuit 6A.

Also in this embodiment, like the first embodiment, the step-up voltage ΔVPGM in operating the step-up operation is controlled.

FIG. 7A to FIG. 7D are schematic diagrams illustrating the control of the step-up voltage ΔVPGM.

Figure 7A:
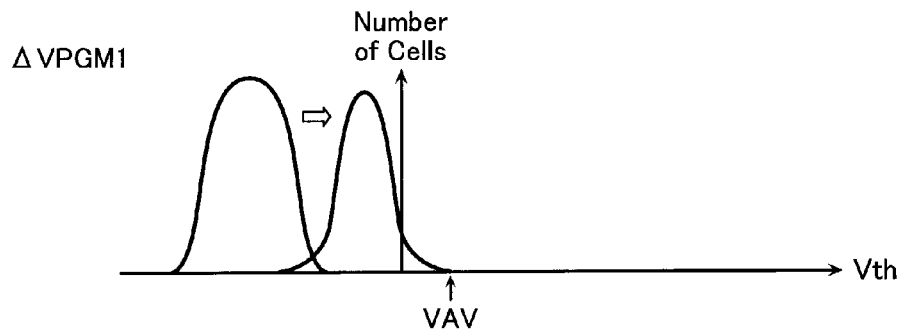
FIG. 7A is a schematic diagram illustrating a programming operation and a step-up operation according to the second embodiment.

With reference to FIG. 7A, at the beginning of the programming operation, the step-up voltage ΔVPGM is set to the high value ΔVPGM1. During this operation, the bit scan circuit 4 counts the number of data sets determined as "PASS", among data sets read by the verify read operation using the verify voltage VAV.

Figure 7B:
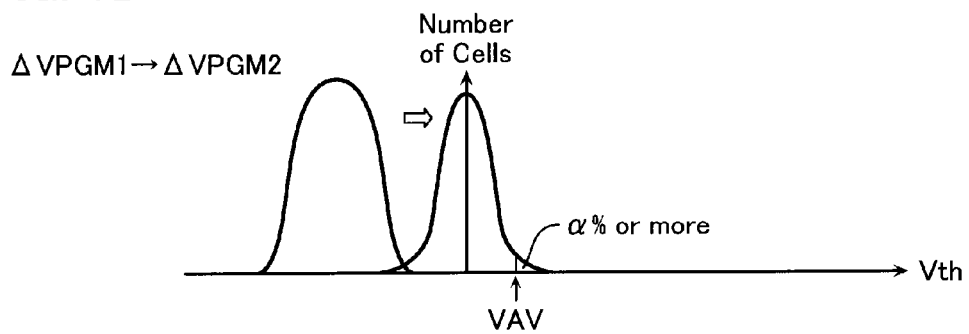
FIG. 7B is a schematic diagram illustrating a programming operation and a step-up operation according to the second embodiment.

When the number of memory cells MC along one word line that have showed "PASS" is equal to or more than α% of the total number, the control circuit 6 switches the step-up voltage ΔVPGM from ΔVPGM1 to ΔVPGM2 (FIG. 7B).

Figure 7C:
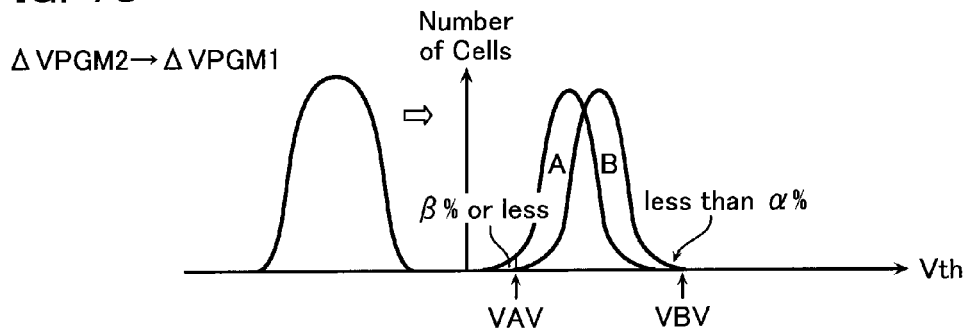
FIG. 7C is a schematic diagram illustrating a programming operation and a step-up operation according to the second embodiment.

If, then, the programming operation proceeds and (100−β) % or more of the threshold voltage distribution A becomes higher than the verify voltage VAV, as shown in FIG. 7C, the progress of the write of the threshold voltage distribution B is used to determine whether to return the step-up voltage ΔVPGM from ΔVPGM2 to ΔVPGM1. The progress of the write of the threshold voltage distribution B is determined in the bit scan circuit 4.

If the write of the threshold voltage distribution B does not sufficiently proceed and only less than α% is "PASS" (having reached the verify voltage VBV), the step-up voltage ΔVPGM is returned from ΔVPGM2 to ΔVPGM1 (FIG. 7C).

Figure 7D:
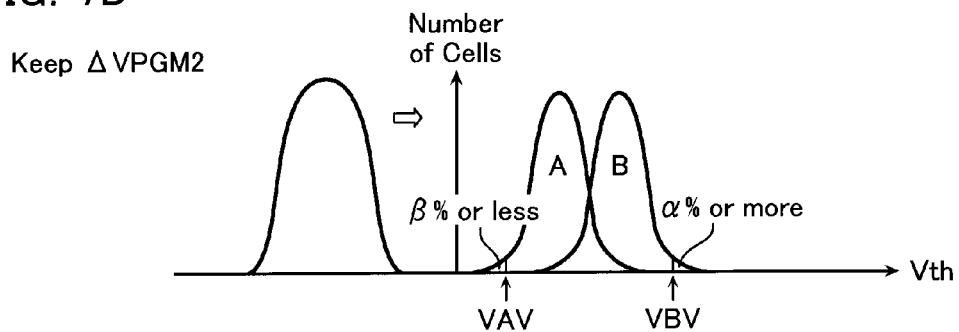
FIG. 7D is a schematic diagram illustrating a programming operation and a step-up operation according to the second embodiment.

If the write of the threshold voltage distribution B sufficiently proceeds and α% of the memory cells or more are already written to the verify voltage VBV or more, the step-up voltage ΔVPGM is not returned from ΔVPGM2 to ΔVPGM1, and the step-up operation using ΔVPGM2 is continued (FIG. 7D). This is because, in this case, return to ΔVPGM1 increases the width of the main distribution of the threshold voltage distribution B.

Figure 8A:
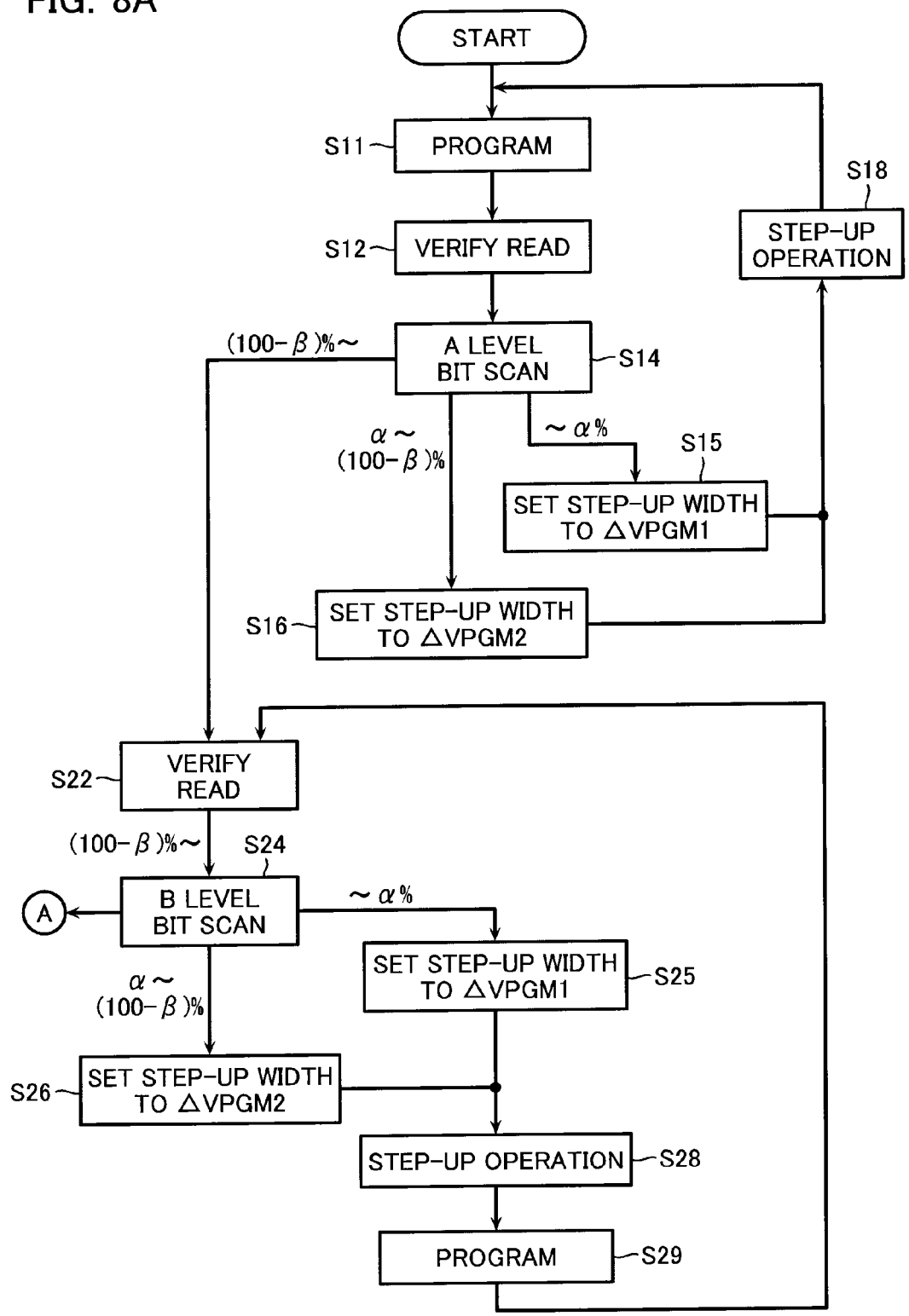
FIG. 8A is a flowchart of a procedure for a programming operation, a verify read operation, and a step-up operation according to the second embodiment.

Referring now to the flowcharts in FIG. 8A and FIG. 8B, the programming operation of a NAND flash memory according to this embodiment will be described.

At the beginning of the programming operation, the initial value of the step-up voltage ΔVPGM is set to ΔVPGM1. The control circuit 6 applies the selected word line WL with the initial value VPGM1 as the programming voltage VPGM to perform a programming operation along the selected word line WL (S11). Then, the selected word line WL is applied with the verify voltage VAV to perform the verify read operation to the memory cells MC along the selected word line WL (S12).

According to the result of the verify read operation using the verify voltage VAV, a bit scan operation (an A level bit scan) is performed of counting the number of memory cells MC determined as "PASS" by the bit scan circuit 4 (S14). In other words, the number of memory cells determined as "PASS" is determined.

If the number of memory cells MC determined as "PASS" is less than α%, the step-up voltage ΔVPGM remains as the initial value ΔVPGM1 (S15). As the programming voltage VPGM, a voltage higher by ΔVPGM1 than the immediately preceding value VPGM' is set (a step-up operation: S18), and a programming operation using the stepped-up programming voltage is performed.

If the number of memory cells MC determined as "PASS" in the bit scan circuit 4 is equal to or more than α% and less than (100−β) %, the step-up voltage ΔVPGM is switched from the initial value ΔVPGM1 to ΔVPGM2 (S16), and an programming operation is performed of applying a programming voltage VPGM (=VPGM'+ΔVPGM2) that is higher by ΔVPGM2 than the immediately preceding value VPGM' (S18). And then, during the period until the number of memory cells MC determined as "PASS" in the bit scan circuit 4 is equal to or more than (100−β)%, the step-up voltage ΔVPGM2 is used.

If the number of memory cells MC determined as "PASS" in the bit scan circuit 4 is equal to or more than (100−β) %, the selected word line WL is applied with the verify voltage VBV to perform the verify read operation to the memory cells MC along the selected word line WL (S22).

According to the result of the verify read operation using the verify voltage VBV, a bit scan operation (an B level bit scan) is performed of counting the number of memory cells MC determined as "PASS" by the bit scan circuit 4 (S24). In other words, the number of memory cells determined as "PASS" is determined.

If the number of memory cells MC determined as "PASS" is less than α%, the step-up voltage ΔVPGM is switched to the initial value ΔVPGM1 (S25). As the programming voltage VPGM, a voltage higher by ΔVPGM1 than the immediately preceding value VPGM' is set (a step-up operation: S28), and a programming operation using the stepped-up programming voltage is performed (S29). And then, the verify read operation and the bit scan operation are performed again.

If the number of memory cells MC determined as "PASS" in the bit scan circuit 4 is equal to or more than α% and less than (100−β) %, the step-up voltage ΔVPGM is set to ΔVPGM2 (S26), and an programming operation is performed of applying a programming voltage VPGM that is higher by ΔVPGM2 (=VPGM'+ΔVPGM2) than the immediately preceding value VPGM' (S28 and S29). And then, the verify read operation and the bit scan operation are performed again.

Figure 8B:
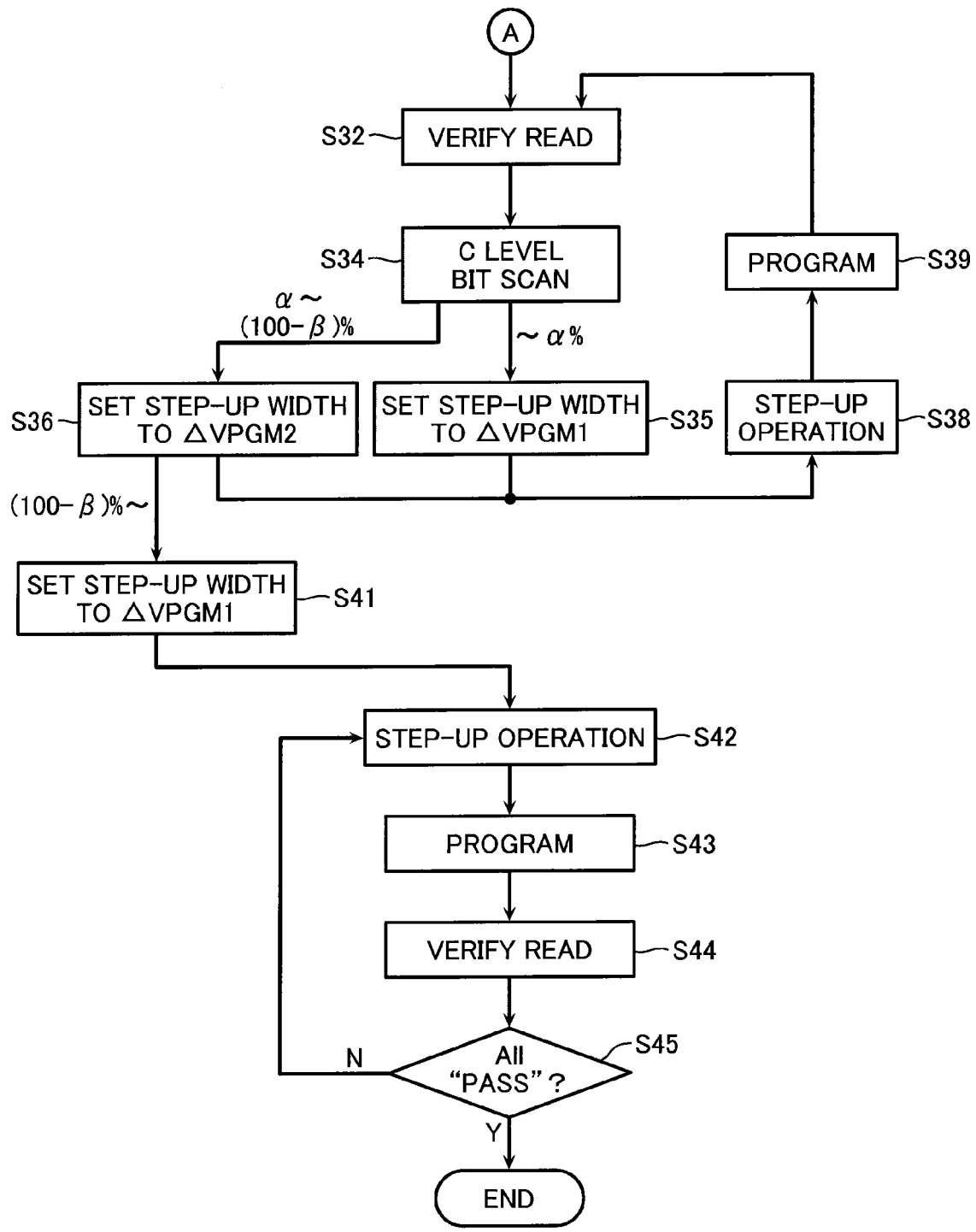
FIG. 8B is a flowchart of a procedure for a programming operation, a verify read operation, and a step-up operation according to the second embodiment.

If the number of memory cells MC determined as "PASS" by the B level bit scan in the bit scan circuit 4 is equal to or more than the (100−β) %, the selected word line WL is applied with the verify voltage VCV to perform the verify read operation to the memory cells MC along the selected word line WL, as shown in FIG. 8B (S32).

According to the result of the verify read operation using the verify voltage VCV, a bit scan operation (an C level bit scan) of counting the number of memory cells MC determined as "PASS" by the bit scan circuit 4 is performed (S34). In other words, the number of memory cells determined as "PASS" is determined.

If the number of memory cells MC determined as "PASS" is less than α%, the step-up voltage ΔVPGM is switched to the initial value ΔVPGM1 (S35). As the programming voltage VPGM, a voltage higher by ΔVPGM1 than the immediately preceding value VPGM' is set (a step-up operation: S38), and a programming operation using the stepped-up programming voltage is performed (S39).

If the number of memory cells MC determined as "PASS" in the bit scan circuit 4 is equal to or more than α% and less than (100−β) %, the step-up voltage ΔVPGM is set to ΔVPGM2 (S36), and an programming operation is performed of applying a programming voltage VPGM (=VPGM'+ ΔVPGM2) that is higher by ΔVPGM2 than the immediately preceding value VPGM' (S38 and S39).

If the number of memory cells MC determined as "PASS" by the C level bit scan in the bit scan circuit 4 is equal to or more than (100−β) %, the step-up voltage ΔVPGM is fixed to ΔVPGM1 (S41), and the step-up operation, the programming operation, and the verify read operation are repeated until all memory cells are determined as "PASS" (S43 to S45). The above flow may provide the operations described in FIG. 8A to FIG. 8B.

Figure 9:
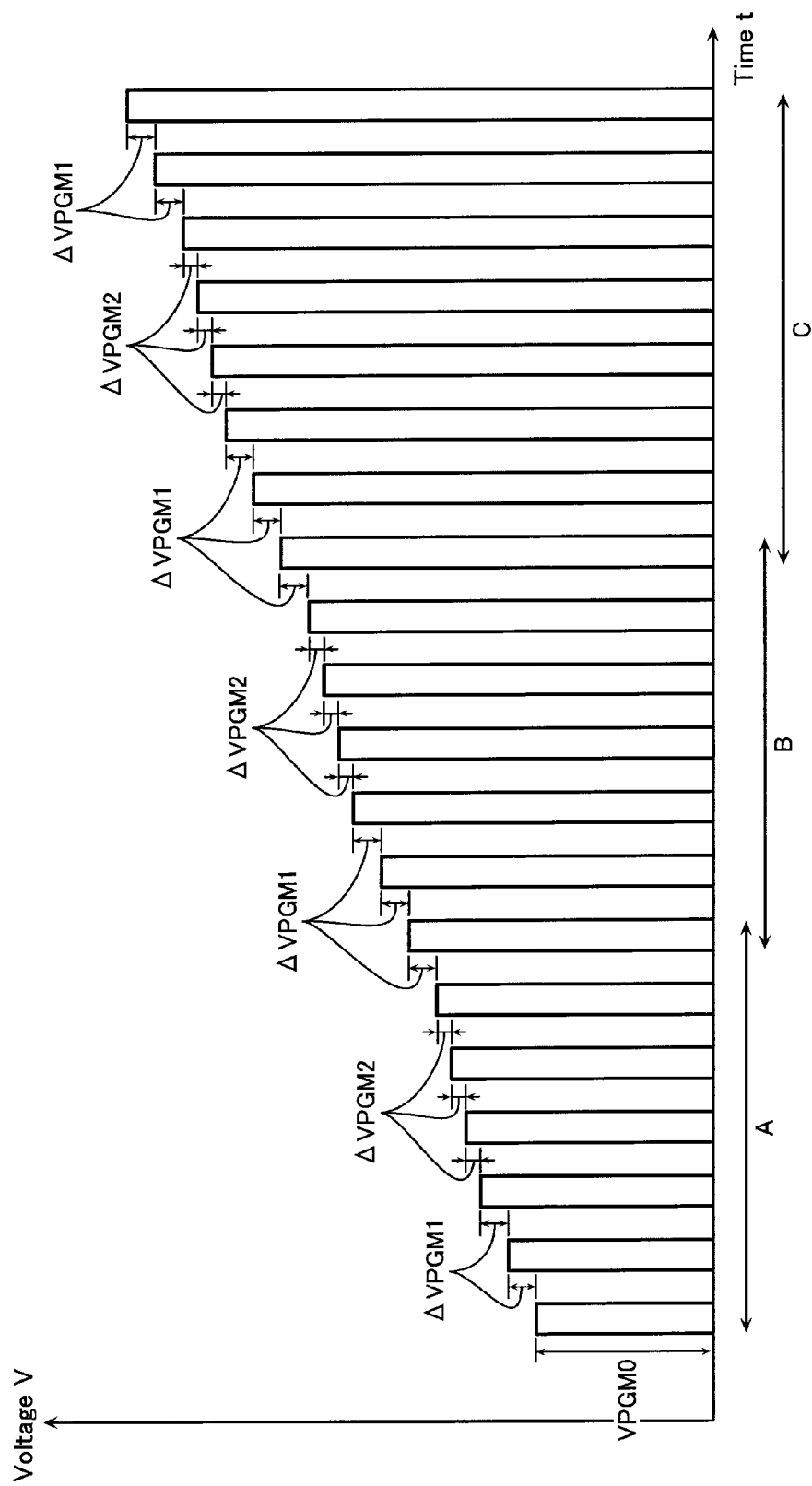
FIG. 9 is a graph of an example change of a programming voltage VPGM and a step-up voltage ΔVPGM.

As a result of the above operations, the programming voltage VPGM changes, for example as shown in FIG. 9, in the process of sequentially completing the writing of threshold voltage distribution A, the writing of B, and the writing of C. The step-up voltage ΔVPGM is not fixed and changes according to the progress of the programming operation.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 10:
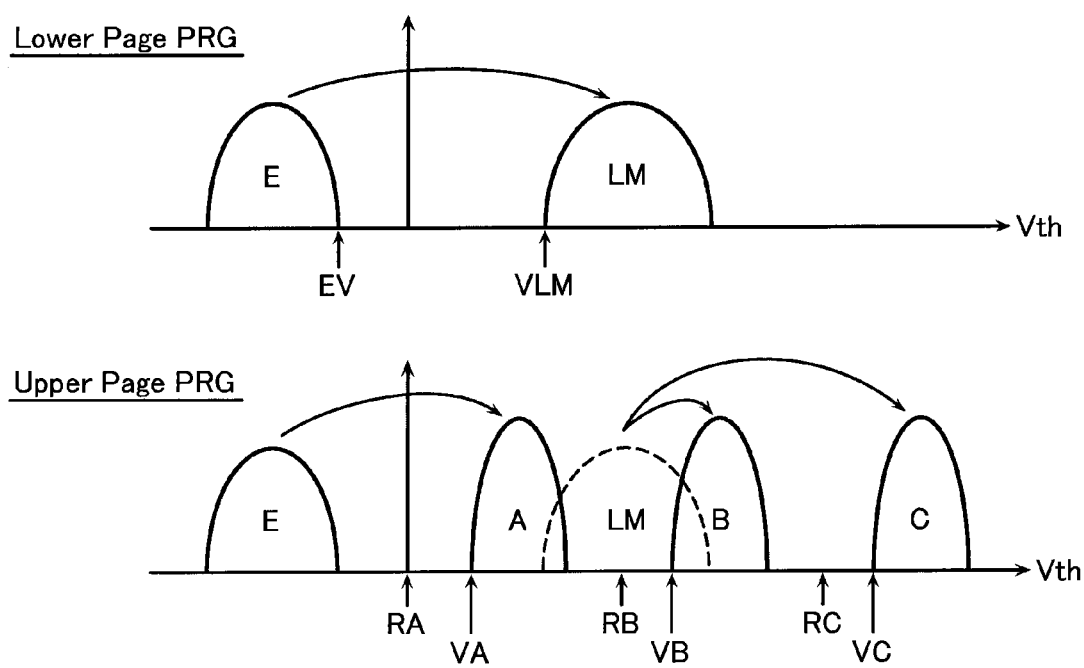
FIG. 10 illustrates a modified example.

For example, although the above embodiments are described with respect to a programming operation of sequentially writing the threshold voltage distributions A, B, and C from the threshold voltage distribution E, the invention is not limited thereto. The above embodiments may also be applied to a write scheme as shown in FIG. 10, for example. In the lower page write, the intermediate distribution LM is written from the threshold voltage distribution E, and in the following upper page write, the distribution A is written from the threshold voltage distribution E and the threshold voltage distributions B and C are written from the intermediate distribution LM.

Figure 11:
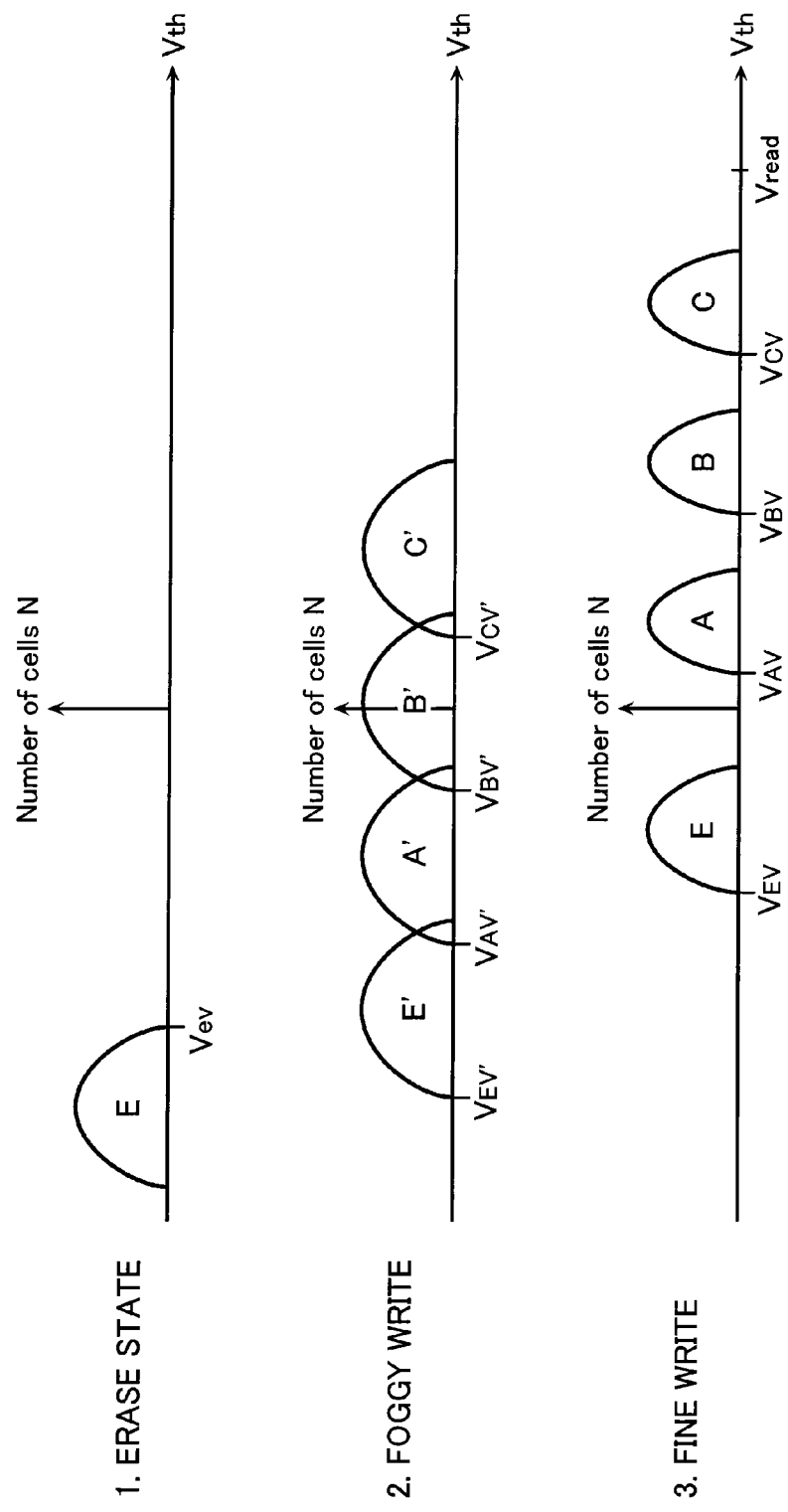
FIG. 11 illustrates another modified example.

Further, as shown in FIG. 11, a programming operation (foggy/fine write) may also be performed using the above embodiments. In a first programming operation (foggy write), threshold voltage distributions A', B', and C' having a wide distribution width are written, using verify voltages VAV', VBV', and VCV' lower than the final verify voltages VAV, VBV, and VCV. Then, in a second programming operation (fine write), the final threshold voltage distributions A, B, and C are written from the distributions A', B', and C', using the verify voltages VAV, VBV, and VCV.

What is claimed is:

1. A non-volatile semiconductor memory device comprising:
    a memory cell array comprising a plurality of blocks, each block comprising a set of NAND cell units, each NAND cell unit comprising a memory string and a first select gate transistor and a second select gate transistor connected to the ends of the memory string, the memory string comprising a plurality of non-volatile memory cells connected in series;
    a word line commonly connecting control gates of the memory cells arranged in a direction intersecting the memory string;
    a bit line connected to a first end of the NAND cell unit;
    a source line connected to a second end of the NAND cell unit;
    a sense amplifier circuit configured to sense a potential of the bit line and determining data held in the memory cell;
    a control circuit configured to perform a write operation to 1-page memory cells along a selected word line, by applying a write pulse voltage to the selected word line, and then performing a verify read operation of confirming whether the data write to the 1-page memory cells is completed, and when the data write is not completed, performing a step-up operation of raising the write pulse voltage by a step-up voltage; and
    a bit scan circuit configured to determine whether the number of memory cells determined to reach a certain threshold voltage is equal to or more than a certain number among the memory cells read at the same time, according to read data held in the sense amplifier circuit as a result of the verify read operation,
    the control circuit being configured to change an amount of the step-up voltage, according to the determination of the bit scan circuit.

2. The non-volatile semiconductor memory device according to claim 1, wherein
    the control circuit configured to perform:
    a first control of changing the amount of the step-up voltage from a first value to a second value less than the first value, when the number of memory cells determined to have reached a first threshold voltage is equal to or more than a first number, among the memory cells along one word line; and
    a second control of changing the amount of the step-up voltage from the second value to the first value, when the number of memory cells determined to have reached the first threshold voltage is equal to or more than a second number greater than the first number, among the memory cells along one word line.

3. The non-volatile semiconductor memory device according to claim 2, further comprising an error correction circuit correcting an error of data held in the memory cell, and wherein
    the first number and the second number are determined according to a bit number recoverable by the error correction circuit.

4. The non-volatile semiconductor memory device according to claim 2, wherein
    the threshold voltage distribution of each memory cell comprises a main distribution included in a certain variance of a normal distribution, an upper tail distribution having a higher voltage level than the main distribution, and a lower tail distribution having a lower voltage level than the main distribution, and
    the first number and the second number are defined according to the number of memory cells included in the upper tail distribution and the lower tail distribution.

5. The non-volatile semiconductor memory device according to claim 1, wherein
    the control circuit configured to perform:
    a first control of changing the amount of the step-up voltage from a first value to a second value less than the first value, when the number of memory cells determined to have reached a first threshold voltage is equal to or more than a first number among the memory cells along one word line; and
    a second control of maintaining the amount of the step-up voltage at the second value, when the number of memory cells determined to have reached a second threshold voltage higher than the first threshold voltage is equal to or more than the first number among the memory cells along one word line.

6. The non-volatile semiconductor memory device according to claim 5, further comprising an error correction circuit configured to correct error of data held in the memory cell, and wherein
the first number and the second number are determined according to a bit number recoverable by the error correction circuit.

7. The non-volatile semiconductor memory device according to claim 5, wherein
the threshold voltage distribution of each memory cell comprises a main distribution included in a certain variance of a normal distribution, an upper tail distribution having a higher voltage level than the main distribution, and a lower tail distribution having a lower voltage level than the main distribution, and
the first number and the second number are defined according to the number of memory cells included in the upper tail distribution and the lower tail distribution.

8. The non-volatile semiconductor memory device according to claim 1, wherein
the control circuit performs a write operation from a first threshold voltage distribution indicating an erased state to an intermediate distribution, and then a write operation of providing a second threshold voltage distribution from the first threshold voltage distribution and the intermediate distribution.

9. The non-volatile semiconductor memory device according to claim 8, wherein
the control circuit performs a first write operation of changing the first threshold voltage distribution indicating an erased state to the second threshold voltage distribution having a first distribution width using a first verify voltage, and then performs a second write operation of changing the second threshold voltage distribution to a third threshold voltage distribution having a second distribution width less than the first distribution width, using a second verify voltage higher than the first verify voltage.

10. A method of writing to a non-volatile semiconductor memory device comprising: a memory cell array comprising a plurality of blocks, each block comprising a set of NAND cell units, each NAND cell unit comprising a memory string and a first select gate transistor and a second select gate transistor connected to the ends of the memory string, the memory string comprising a plurality of non-volatile memory cells connected in series; and a word line commonly connecting control gates of the memory cells arranged in a direction intersecting the memory string,
the method comprising:
performing a write operation to 1-page memory cells along a selected word line, by applying a write pulse voltage to the selected word line;
performing a verify read operation of confirming whether the data write to the 1-page memory cells is completed;
performing a bit scan operation of determining whether the number of memory cells determined to reach a certain threshold voltage is equal to or more than a certain number among the memory cells read at the same time, according to the result of the verify read operation;
raising the write pulse voltage by a step-up voltage when the data write is not completed, and changing the amount of the step-up voltage according to the result of the bit scan operation; and
performing a write operation again to the 1-page memory cells, by applying a raised write pulse voltage to the selected word line.

11. The method according to claim 10, further comprising:
a first control of changing the amount of the step-up voltage from a first value to a second value less than the first value, when the number of memory cells determined to have reached a first threshold voltage is equal to or more than a first number, among the memory cells along one word line; and
a second control of changing the amount of the step-up voltage from the second value to the first value, when the number of memory cells determined to have reached the first threshold voltage is equal to or more than a second number greater than the first number, among the memory cells along one word line.

12. The method according to claim 11, wherein
the first and second numbers are determined according to a bit number recoverable by an error correction circuit correcting an error of data held in the memory cell.

13. The method according to claim 10, further comprising:
a first control of changing the amount of the step-up voltage from a first value to a second value less than the first value, when the number of memory cells determined to have reached a first threshold voltage is equal to or more than a first number among the memory cells along one word line; and
a second control of maintaining the amount of the step-up voltage at the second value, when the number of memory cells determined to have reached a second threshold voltage higher than the first threshold voltage is equal to or more than the first number among the memory cells along one word line.

* * * * *